United States Patent [19]

Yoshii

[11] Patent Number: 4,970,513
[45] Date of Patent: Nov. 13, 1990

[54] DEVICE FOR CONVERTING AN ANALOG SIGNAL INTO A DIGITAL SIGNAL OF A PARALLEL COMPARISON TYPE WITH ERROR SUPPRESSION CIRCUITS

[76] Inventor: Yoji Yoshii, c/o Sony Corporation, 7-35, Kitashinagawa 6- chome, Shinagawa-ku, Tokyo, Japan

[21] Appl. No.: 151,984

[22] Filed: Feb. 3, 1988

[30] Foreign Application Priority Data

Feb. 13, 1987 [JP] Japan .................. 62-030762

[51] Int. Cl.$^5$ ............................................. H03M 1/36
[52] U.S. Cl. .................................. 341/159; 341/155; 341/158
[58] Field of Search ............... 341/156, 159, 155, 158, 341/161

[56] References Cited

U.S. PATENT DOCUMENTS

| | | | |
|---|---|---|---|
| 3,877,025 | 4/1975 | Maio ..................................... | 341/159 |
| 4,122,439 | 10/1978 | Ninomiya ............................. | 341/156 |
| 4,417,233 | 11/1983 | Inoue et al. ......................... | 341/156 |
| 4,639,715 | 1/1987 | Doluca ................................. | 341/120 |
| 4,641,129 | 2/1987 | Doluca et al. ...................... | 341/156 |

Primary Examiner—William M. Shoop, Jr.
Assistant Examiner—Brian K. Young

[57] ABSTRACT

A device for converting an analog signal into a corresponding N-bit digital signal (A/D converter) of a parallel comparison type is disclosed having a $2^{N-M}$ number of M-bit encoders, a single N-bit encoder, and error suppression circuits, a block indicating signal on a block indicating line belonging to each M-bit encoder serving as an output inhibit signal for one of the other error suppression circuits connected to the M-bit encoder in one lower order for higher order) with respect to the corresponding M-bit encoder, and the block indicating line of each M-bit encoder being connected to an output terminals of one of the comparators in a lowest order (or highest order) or a few comparators in the comparator group to which the corresponding M-bit encoder is connected. Therefore, if an output signal is generated from the highest comparator for lowest comparator) in the comparator group whose output terminals are connected to the corresponding M-bit encoder, the transmission of the output signal of the M-bit encoder in one lower order (or higher order) to the N-bit encoder is interrupted by means of the corresponding error suppression circuits when the output signal from the one lower order (or higher order) is generated. The block indicating signal is directly used as the output inhibit signal for the one lower order error suppression signal so that no particular gate circuit is needed, thus reducing the number of transistors. In addition, the small number of comparators are connected to the block indicating line so that the number of transistors is accordingly reduced.

11 Claims, 2 Drawing Sheets

DEVICE FOR CONVERTING AN ANALOG SIGNAL INTO A DIGITAL SIGNAL OF A PARALLEL COMPARISON TYPE WITH ERROR SUPPRESSION CIRCUITS

BACKGROUND OF THE INVENTION (1) Field of the Invention

The present invention relates to a device for converting an analog signal into a digital signal (A/D converter) of a parallel comparison type with error suppression circuits, a $2^{N-M}$ number of M-bit encoders, and one N-bit encoder.

(2) Background of the Art

A parallel type or parallel comparison type analog-to-digital (A/D) converter having a superior high-speed operating characteristic is commonly used as the A/D converter.

An N-bit parallel type A/D converter generally includes $2^N-1$ numbers of comparison circuits disposed in parallel with each other and $2^N$ numbers of serially connected resistors having mutually equal resistance values and across which a reference voltage (e.g., 2 volts is applied so as to provide an equal divided voltage across each resistor and to provide $2^N-1$ numbers of mutually different comparison voltages at terminals between the mutually adjacent resistors. Thus, each comparison voltage provided by the resistors is supplied to one of the input terminals of the corresponding comparison circuit and an input analog voltage is supplied to the other input terminal of each comparison circuit so that the comparison circuits detect which of these comparison circuits is nearest to the input analog voltage. Then, the A/D converter of the parallel comparison type encodes the detection result through a coincidence circuit to provide the N-bit digital signal indicating the digital value of the input analog voltage through the N-bit encoder.

If the number of bits of the above-described parallel A/D converter are, for example, eight bits (N=8), the numbers of resistors, comparison circuits, and gates in the coincidence circuitry reach 256 and the layout of the 8-bit A/D converter becomes very long when these circuit elements are aligned in a row.

That is to say, if such an 8-bit A/D converter is arranged on a single semiconductor chip in a rectangular shape, the layout thereof will be described below.

The 8-bit A/D converter described above is, e.g., divided into four blocks, each block being arranged in a unidirection and having a 6-bit encoder built therein. Then, an output signal of each 6-bit encoder is supplied to a single 8-bit encoder from which the 8-bit digital signal is outputted. Each block includes a comparator group, each group having 64 comparators. It is noted that each comparator includes a combination of one resistor, one comparison circuit, and one gate.

One comparator group belonging to one block is thus constituted by 64 comparators. Each number from 0 to 254 is sequentially allocated to all comparators of the A/D converter in an order from a lower significant number 0 to an upper significant number 255. It is noted that although the comparator in the order of 255 is present, it is not connected to the corresponding encoder.

Each 6-bit encoder is in a matrix form in which six bit lines are present for providing a 6-bit output signal thereat and a single block indicating line BDB is provided. The block indicating line BDB functions to inform the 8-bit encoder that a coincidence detection signal is transmitted from any one of the comparators or a particular comparator to the 6-bit encoder itself in the corresponding block to which the 6-bit encoder belongs.

Error suppression circuits are connected between respective blocks and the 8-bit encoder for preventing occurrence of errors by inhibiting the output of the signal from the 6-bit encoder connected to the corresponding error suppression circuit to the 8-bit encoder upon receipt of an output inhibit signal. The output inhibit signal is transmitted in a sequence from the highest error suppression circuit connected to the uppermost order block to the lowest order error suppression circuit connected to the lowest order block.

The details of one of the previously proposed parallel type A/D converters with the error suppression circuits will be described below.

In each 6-bit encoder of the blocks in the matrix construction, seven signals transmitted via the 6-bit bit lines and block indicating line BDB are inputted to the 8-bit encoder via a latch circuit and the corresponding error suppression circuit.

All seven signals passed through the latch circuit are also inputted to an OR gate circuit. An output signal of the OR gate circuit is then transmitted to the adjacent lower order error suppression circuit as the output inhibit signal. Hence, each of the error suppression circuits receives the output inhibit signal from its adjacent, one upper-order block.

The above-described block indicating line BDB is connected to output terminals of all comparators of each comparator group connected to the 6-bit encoder of the corresponding group.

The error suppression circuits are provided for preventing a transient occurrence of a large error of such an order as indicated by $2^6$.

The transient occurrence of such a large error will specifically be described below.

For example, when the input analog voltage is changed in such a way as initially from a value slightly smaller than the value of 2 such as a (reference voltage)$\times 192/256$, intersecting this value, and exceeding this value to a larger value, one of the comparators generating the output signal is changed sequentially in such a way that the output signal is generated from the comparator of the second block in the order of 65, the output signal is generated from the comparator of the second block in the order of 64, the output signal is generated from the comparator of the first block in the order of 63, and the output signal is thereafter generated from the comparator in the order of 62.

Although the block indicating signal BDB is outputted from the block indicating line of the second 6-bit encoder until the output signal from the comparator of the order of 64 is generated, the block indicating signal vanishes, which has been outputted via the block indicating line BDB of the second 6-bit encoder, when the comparator in the order of 63 generates the output signal. The change of the output bit status in the 8-bit encoder, i.e., the A/D converter is shown as follows during this period.

| | | |
|---|---|---|
| 01000001 | ← | $9_{65}$ |
| 01000000 | ← | $9_{64}$ |
| 00111111 | ← | $9_{63}$ |

-continued

| 00111110 | ← | 9₆₂ |

It is noted that in this case, the digital output when the output signal is generated from the comparator in the first order of 0 indicates 00000000 and that when generated from the comparator in the last order of 254 indicates 11111111.

However, the above-described change of the output digital signal is a case where each circuit element is ideally operated without delay. The operating speed of each circuit element is actually different for different circuit elements.

For example, if a delay of operation occurs in the second 6-bit encoder, a transient state often occurs such that the block indicating signal of the second 6-bit encoder does not vanish but remains 1 although the six bits of the first 6-bit encoder have already indicated 111111 when 01000000 is changed to 00111111.

In this case, the digital output signal is changed in the way described below.

| 01000000 |
| 01111111 |
| 00111111 |

In other words, the output signal indicating 01111111 often or seldom appears when changing from 01000000 to 00111111, although this phenomenon is transient.

This is a large indication error of the output signal since it is different from such an error as occurring in the output digit of a least significant bit (LSB) or near thereto.

To cope with such a transient error phenomenon, the error suppression circuits for the respective blocks are installed in the A/D converter.

Hence, e.g., when the output signal is generated from the second 6-bit encoder, the output inhibit signal is transmitted from the second 6-bit encoder to the first-order error suppression circuit. At this time, if the first line of the six bit lines of the first 6-bit encoder is generated, the input of the output signal therefrom to the 8-bit encoder is interrupted by this output inhibit signal. Hence, no large error occurs in the A/D converter described above.

However, the above-described previously proposed parallel type A/D converter has a drawback such very large numbers of elements such as transistors in the A/D converter.

That is to say, output lines of the comparators are connected to the 6-bit encoder in the matrix construction belonging to the same block and each 6-bit encoder is connected to each input line connected to the 8-bit encoder via transistors (or diodes), respectively. As the number of the connection points are increased, the number of transistors (or diodes) to be used is accordingly increased. Therefore, if the block indicating line BDB of the corresponding 6-bit encoder is connected to all comparators of the group, the number of the connection points requires 64 per block due to the connection of the output lines of the comparators to the block indicating lines.

This does not only result in an increase of the number of elements but also in a heavy load on each block indicating line. Consequently, the high speed operating characteristic inherent to the parallel type A/D converter deteriorates.

In addition, since the output inhibit signal to be transmitted to one of the error suppression circuits in one lower order is formed by passing the seven signals transmitted via the 6-bit bit lines and block indicating line through the OR gate circuit 12, the number of input terminals to the OR gate circuit therefore reaches seven. This is also a factor for increasing the number of circuit elements, such as transistors.

Since the number of transistors per input terminal in the OR gate circuit are greater, as many as 1 to 3, 7 to 21 transistors must be used in the signal inputting portion of the single OR gate circuit. When the input signal is transmitted through the OR gate circuit, its output inhibit signal is delayed. This makes the A/D converter disadvantageous.

In the manner described above, the previously proposed parallel type A/D converter has problems of such as the large number of circuit elements used therein and of providing unfavorable effects on the high-speed operating characteristic inherent to the A/D converter of the parallel comparison type.

SUMMARY OF THE INVENTION

It is, therefore, an object of the present invention to provide a device for converting an analog signal to a digital signal having error suppression circuits in a parallel comparison type in which the member of transistors or diode circuit elements is reduced and high-speed operating characteristic inherent thereto is improved.

This can be achieved by providing a device for converting an analog signal into a corresponding digital signal, comprising: (a) at least $2^N-1$ number of comparators divided into $2^{N-M}$ number of comparator groups, each comparator receiving and comparing the analog voltage with a predetermined voltage and outputting a signal according to the comparison result; (b) a $2^{N-M}$ number of M-bit encoders, each disposed so as to receive the signals from the comparators belonging to the corresponding group, having a block indicating line for transmitting a block indicating signal whether any one predetermined comparator in the corresponding group outputs the signal, and outputting the M-bit encoded signal; (c) a signle N-bit encoder for receiving the M-bit encoded signal and outputting the N-bit encoded digital signal; and (d) a $2^{N-M}$ number of error suppression circuits, each for inhibiting the transmission of the M-bit encoded signal from the M-bit encoder belonging to the corresponding group to the N-bit encoder upon receipt of an output inhibit signal, the output inhibit signal being the block indicating signal derived from one of the M-bit encoders belonging to one of the other groups which is one higher order or lower order, and the block indicating line of each M-bit encoder being connected to at least one output terminal of the comparator in a lowest or highest order belonging to the corresponding group connected to the M-bit encoder.

This can be achieved by providing a device for converting an analog signal to a digital signal, comprising: (a) at least $2^N-1$ number of comparators divided into $2^{N-M}$ number of groups, each for receiving and comparing the analog signal with a predetermined voltage and outputting a signal when the analog signal substantially equal to the predetermined voltage; (b) an M-bit encoder connected to the comparators belonging to each corresponding group for receiving and encoding the signals derived from the comparators, the M-bit encoder having a block indicating line for transmitting a block indicating signal indicating whether at least one predetermined comparator, belonging to the corresponding group, outputs the signal and outputting the M-bit encoded signal; (c) a single N-bit encoder for receiving the M-bit encoded signal from each M-bit encoder and outputting an N-bit encoded digital signal; and (d) means for suppressing bit indication errors in the N-bit encoder, the means intervened between each M-bit encoder, and N-bit encoder except at least one of the M-bit encoders in a highest order or lowest order, preventing the superposition of the signals derived from both M-bit encoders mutually adjacent to each other, and being activated upon receipt of an output inhibit signal derived from either of the adjacent M-bit encoder, the output inhibit signal being derived from the output signal of the predetermined comparator connected to the corresponding M-bit encoder.

This can also be achieved by providing a device for converting an analog signal into a digital signal of an 8 bit pattern, comprising: (a) 255 comparators divided into four numbers of comparator groups, each comparator receiving and comparing the analog signal with a predetermined voltage and outputting a signal according to the comparison result; (b) four 6-bit encoders, each disposed so as to receive the signals from the comparators belonging to the corresponding group, having a block indicating line for transmitting a block indicating signal indicating whether any one predetermined comparator in the corresponding group outputs the signal, and outputting the 6-bit encoded signal; (c) a single encoder for receiving the 6-bit encoded signal from each of the 6-bit encoders and outputting the 8-bit encoded digital signal; and (d) six error suppression circuits each for inhibiting the transmission of the 6-bit encoded signal from the 6-bit encoder belonging to the corresponding group to the N-bit encoder upon receipt of an output inhibit signal, the output inhibit signal being the block indicating signal derived from one of the M-bit encoders belonging to one of the other groups which is one higher or lower order, and the block indicating line of each 6-bit encoder being connected to at least one output terminal of the comparator in a lowest order or highest order belonging to the corresponding group connected to the 6-bit encoder.

DETAILED DESCRIPTION OF THE PREFERRED EMBODIMENT

Figure 1:
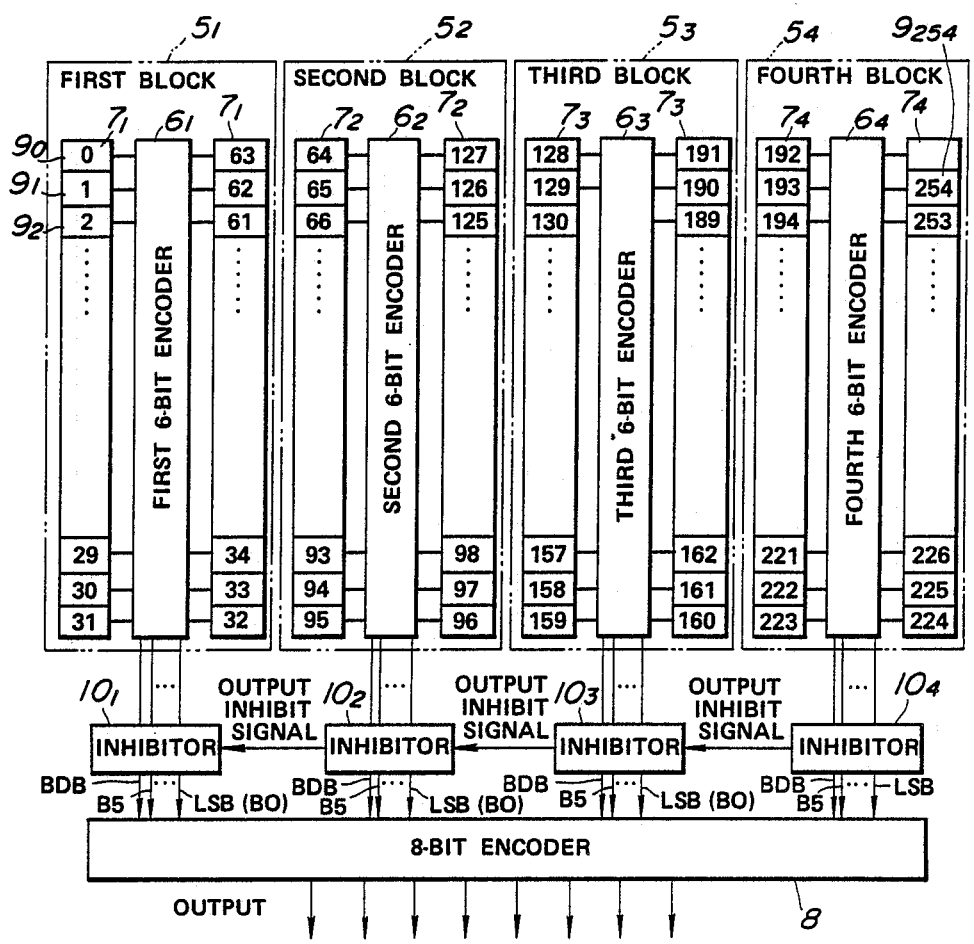
FIG. 1(A) is a simplified circuit block diagram of a whole construction of an 8-bit parallel comparison type A/D converter to which the present invention is applicable.
FIG. 1(B) is a detailed circuit wiring diagram of each comparator shown in FIG. 1.
Figure 1:
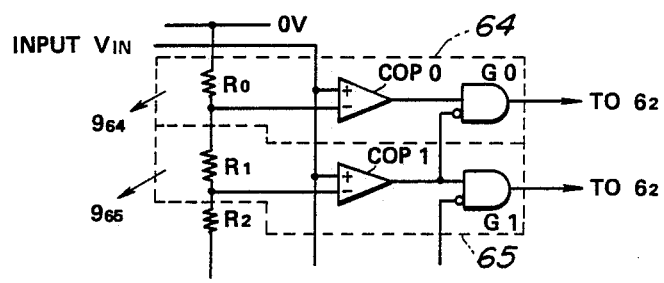

Reference will hereinafter be made to the drawing in order to facilitate understanding of the present invention.

Figure 2:
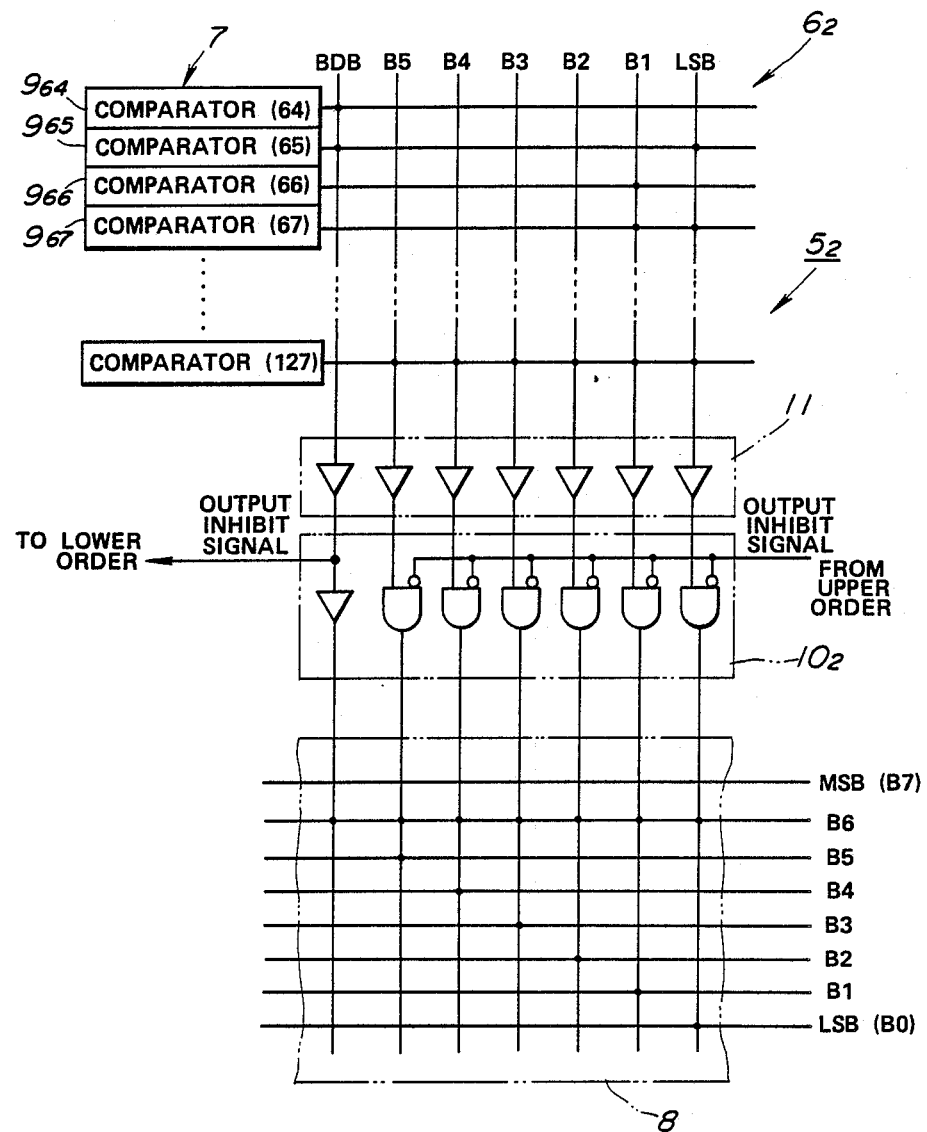
FIG. 2 is a circuit block diagram of each block of the 8-bit parallel comparison type A/D converter in a preferred embodiment according to the present invention.

FIG. 2 shows a circuit block diagram of an N-bit parallel comparison type A/D (analog to digital) converter in a preferred embodiment according to the present invention.

The whole circuit construction of the parallel comparison type A/D converter in the preferred embodiment shown in FIG. 2 is shown in FIGS. 1(A) and 1(B).

As shown in FIG. 1(A), the A/D converter, in this embodiment an 8-bit A/D converter, is divided into four blocks $5_1$, $5_2$, $5_3$, and $5_4$.

The four blocks $5_1$, $5_2$, $5_3$, and $5_4$ are disposed in parallel with each other and mutually in rows of rectangular shapes. Four 6-bit encoders $6_1$, $6_2$, $6_3$, and $6_4$ are built in the respective blocks. Output signals of the respective 6-bit encoders $6_1$, $6_2$, $6_3$, and $6_4$ are supplied to a single 8-bit encoder 8 so that the 8-bit encoder 8 outputs the 8-bit digital signal. Comparator groups denoted by $7_1$, $7_2$, $7_3$, and $7_4$ belong to the corresponding blocks $5_1$, $5_2$, $5_3$, and $5_4$, each comparator group including 64 comparators $9_O \ldots 9_N$—in number.

Error suppression circuits $10_1$, $10_2$, $10_3$, and $10_4$ are connected between the respectively corresponding blocks $5_1$, $5_2$, $5_3$, and the $5_4$ and 8-bit encoder 8. The error suppression circuits $10_1$, $10_2$, $10_3$, and $10_4$ inhibit the output of signals from the 6-bit encoders 6, to $6_4$ connected with the corresponding error suppression circuits to the 8-bit encoder 8 so that the erroneous output indication of the A/D converter is prevented. Each error suppression circuit 10 receives the output inhibit signal from one of the other error suppression circuits 10 which is located in one higher order in such a way that the first error suppression circuit $10_1$ receives it from the second error suppression circuit $10_2$, the second error suppression circuit $10_2$ from the third error suppression circuit $10_3$, and so on.

Alternatively, the output inhibit signal may be received from one of the other error suppression circuits 10 which is located in one lower order.

It is noted that each comparator $9_0$ to $9_{254}$ includes one of the serially connected resistors $R_{i=0 \text{ to } 254}$, a comparison circuit $COP_{i=0 \text{ to } 254}$, and a gate circuit $G_{i=0 \text{ to } 254}$, as shown in FIG. 1(B).

It is also noted that FIG. 2 shows the circuit block diagram of the second block $5_2$ in the 8-bit A/C converter.

In FIG. 2, a block indicating line BDB for transmitting a block indicating signal indicating whether any one of the comparators 9 in the second block $5_2$ produces the output signal is connected with output terminals of the lowest order comparator $9_{64}$ and of the subsequent order comparator $9_{65}$.

The block indicating line BDB is furthermore connected to a control terminal of the error suppression circuit $10_1$ of the first block $5_1$ which is in its one lower order. The signal generated from the block indicating line BDB, i.e., the block indicating signal, serves as the output inhibit signal for the first block $5_1$ which is placed in the one lower order.

The error suppression circuit $10_2$ shown in FIG. 2 is intervened between the 6-bit encoder $6_2$ and the 8-bit encoder 8 together with a latch circuit 11. The error suppression circuit $10_2$ is controlled by means of the output inhibit signal on the block indicating line BDB of the one higher order block, i.e., the third block $6_3$. The 6-bit bit lines of the 6-bit encoder $6_2$ are connected to their corresponding bit lines in the 8-bit encoder 8 in such a way that the LSB line is connected to the LSB line of the 8-bit encoder 8, the B1 line is connected to the B1 line thereof, and so on.

It is noted that all lines of the 6-bit bit lines and block indicating line BDB of the 6-bit encoder $6_2$ are connected to the bit line B6 subsequent to the MSB line (B7) in the 8-bit encoder 8. It is also noted that the circuit constructions of the other blocks $5_1$, $5_3$, $5_4$ are substantially the same as the second block $5_2$ shown in FIG. 2. However, the block indicating line BDB of the first block $6_1$ serves no purpose although it is present therein. In addition, the 6-bit bit lines of the first 6-bit encoder $6_1$ are merely connected to their corresponding bit lines (B0 to B5) in the 8-bit encoder 8 and are connected to neither the MSB line nor B6 line of the 8-bit encoder 8. Each bit line of the third 6-bit encoder $6_3$ is connected to its corresponding bit line (B0 to B5) of the 8-bit encoder 8 and each bit line of the third 6-bit encoder $6_3$ and its block indicating line BDB are all connected to the MSB line (B7) of the 8-bit encoder.

Furthermore, each bit line of the fourth 6-bit encoder $6_4$ is connected to its corresponding bit line (B0 to B6) of the 8-bit encoder 8 and each bit line and block indicating line BDB are connected to both MSB and B6 line of the 8-bit encoder 8. In this way, each block has a slight difference in its connection to the lines of the 8-bit encoder 8.

In the circuit construction of the A/D converter of the above-described preferred embodiment, the output signal is generated from either the comparator $9_{64}$ in the lowest order in the second block $5_2$ or the comparator $9_{65}$ in one higher order therein. That is to say, when there is a possibility that the output signals are overlapped and transmitted to the 8-bit encoder 8 from the second block $5_2$ and from the first block $5_1$ in one lower order, the output inhibit signal of the comparator $9_{64}$ or $9_{65}$ is transmitted from the block $5_2$ via the block indicating line BDB to the error suppression circuit $10_1$ in the first block $5_1$ (not shown in FIG. 2) as the output inhibit signal. Therefore, the overlapping input of the output signals from the plurality of the 6-bit encoders $6_1$ and $6_2$ into the 8-bit encoder 8 can be prevented.

Thereafter, the number of connecting points between the block indicating line BDB and the comparators 9, 9,—is only two in the preferred embodiment as shown in FIG. 2. Therefore, the number of transistors required to connect the block indicating line BDB and comparators 9 can be reduced. In addition, the load of the transistors can be relieved and accordingly the transmission speed of each block indicating signal can increase.

That is to say, the output terminals of all comparators in each block are connected to the corresponding block indicating line in the previously proposed parallel comparison type A/D converter. However, the occurrence of the signal overlap between any one of the blocks and the adjacent block in one lower order is usually caused when the output signal is generated from either the lowest order comparator or its adjacent comparator 9 in the corresponding block. At this time, such an occurrence is not found when the output signal is generated from any other comparators in the higher order than the above-described order. Hence, according to the present invention, it is not necessary to connect the output terminals of all comparators $9_N$—to the block indicating line BDB.

In this way, in the A/D converter according to the present invention, with the number of the comparators 9 to connect the block indicating line BDB to the output terminals of the comparators reduced, the number of the elements, i.e., transistors and so on can be reduced with the achievement of the effective error suppression.

In addition, the A/D converter according to the present invention, does not produce the output inhibit signal to the error suppression circuit belonging to the lower order block by the input of the block indicating line BDB and 6-bit lines to the OR gate circuit as in the case of the previously proposed A/D converter but directly uses the signal of the block indicating line BDB, i.e., the block indicating signal, as the output inhibit signal for the error suppression circuit in the lower order block. Therefore, no gate circuit having a large number of input terminals is needed to produce the output inhibit signal. Hence, the number of transistors used in the A/D converter can be reduced remarkably and the delay of the output inhibit signal can be reduced accordingly.

It is noted that the number of comparators 9 whose output terminals are connected to the block indicating line BDB are two in the corresponding block as described in the above-described embodiment. However, alternatively, the number of the comparators may be one, i.e., the comparator $9_{64}$ in the lowest order, or may be three of the lower order comparators including the comparator $9_{64}$, or may be four or more. However, if the number of the comparators 9 whose output terminals are connected to the block indicating line BDB are increased, the number of the elements are increased accordingly although the stability of the circuit operation increases. In addition, in so doing, the effect of the present invention becomes reduced.

In the preferred embodiment, the output inhibit signal to each error suppression circuit is received from the upper order error suppression circuit 10. On the contrary, in each block the output inhibit signal may be received from the lower order error suppression circuit.

In this case, the comparators whose output terminals are connected to the block indicating line BDB of the comparators in the upper order including the uppermost order or the comparator in the uppermost order.

In addition, in the preferred embodiment, the 8-bit parallel comparison type A/D converter is divided into four blocks (i.e., N=8, $2^{N-M}=4$ (i.e., M=6)). However, the present invention is not limited to the four blocks but may be divided into eight blocks (i.e., N=8, $2^{N-M}=8$ (i.e., M=5)).

As described above, in the parallel comparison type A/D converter according to the present invention, the $2^N$ or $2^N-1$ number of the comparators are divided into the $2^{N-M}$ number of the comparator groups. The output signals of the respective comparator groups are inputted to their corresponding M-bit encoders. Each M-bit encoder is provided with the M-bit lines and block indicating line for transmitting the block indicating signal indicating whether the signal from any one of the comparators in the comparator group is inputted to itself. The output signal of each M-bit encoder is inputted to the single N-bit encoder. In addition, each error suppression circuit is provided between each M-bit encoder and N-bit encoder for inhibiting the transmission of the signal from the corresponding M-bit encoder to the N-bit encoder upon receipt of the output inhibit signal. In the N-bit parallel comparison type A/D converter in which each error suppression circuit receives the output inhibit signal from the M-bit encoder in one upper order or in one lower order to which it is connected, the error suppression circuits receive the block indicating signals as the output inhibit signals from the respective M-bit encoders in one higher order or one lower order of the respective M-bit encoders to which the respectively corresponding error suppression circuits are connected. The block indicating lines of the respective M-bit encoders are connected to the output terminal of one of the comparators in the comparator group in the lowest order or highest order, or the output terminals of a few comparators in the lower order or higher order inclusive the lowest order comparator or highest order.

Hence, according to the present invention, since the block indicating signal of the block indicating line of each M-bit encoder serves as the output inhibit signal for the error suppression circuit in one upper order or lower order, the error suppression circuit interrupts the input of the output signal into the N-bit encoder even when the output signal is generated from the one upper order or higher order M-bit encoder if the output signal is generated from the comparator in a higher order or lower order of the comparator group whose output terminals are connected to any one of the M-bit encoders. Since the block indicating line signal (i.e., block indicating signal) is the output inhibit signal for the error suppression circuit in one higher order or lower order and no particular gate circuit is used to produce the output inhibit signals, no particular transistor elements to produce the output inhibit signals are required and the number of transistor elements can accordingly be reduced.

Furthermore, each of the block indicating lines of the respective M-bit encoders are connected to the output terminal of one of the comparator in the comparator group in the lowest order or in the highest order or output terminals of the few comparators. Therefore, since the output terminals of all comparators are not connected thereto, the number of connected lines between the output lines of the comparators and block indicating lines can be reduced. In addition, the high speed operating characteristic can be improved and the occurrence of a large error can be prevented without increase of the number of the circuit elements and deterioration of the high speed operating characteristic of the parallel comparison type A/D converter.

What is claimed is:

1. A device for converting an analog signal into a corresponding digital signal having N-bits, comprising:
    (a) at least $2^N - 1$ number of comparators divided into $2^{N-M}$ number of comparator groups where M is a digit less than N, each for receiving and comparing the analog signal with a predetermined voltage and outputting a signal according to the comparison result;
    (b) a $2^{N-M}$ number of M-bit encoders, each disposed so as to receive the signal from the comparators belonging to the corresponding comparator group, having a block indicating line for transmitting a block indicating signal whether any one comparator in the corresponding comparator group outputs the signal, and outputting an M-bit encoded signal;
    (c) a single N-bit encoder for receiving the M-bit encoded signal and outputting an N-bit encoded digital signal; and
    (d) a $2^{N-M}$ number of error suppression circuits, each for inhibiting the transmission of the M-bit encoder belonging to the corresponding comparator group to the N-bit encoder upon receipt of an output inhibit signal, the output inhibit signal being the block indicating signal derived from one of the M-bit encoders belonging to one of the other comparator groups which is one higher or lower order than said corresponding comparator group and the block indicating line of each M-bit encoder being connected to at least one output terminal of the comparator in a lowest or highest order belonging to the corresponding group connected to the M-bit encoder.

2. A device as set forth in claim 1, wherein the block indicating line of each M-bit encoder is connected to the output terminals of at least three the comparators, including the lowest or highest order comparator.

3. A device as set, forth in claim 2, wherein the three comparators include a comparator adjacent to the lowest or highest order comparator.

4. A device as set forth in claim 1, which, but not connected with, further comprises a comparator in a $2^N$ order adjacent to the comparator in the $2^N - 1$ order.

5. A device as set forth in claim 1, wherein each comparator comprises: one of a plurality of serially connected resistors for dividing a reference voltage into the predetermined voltage allocated to the corresponding comparator; a comparison circuit receiving the analog voltage and predetermined voltage and outputting the comparison result between the analog signal and predetermined voltage, and a gate circuit receiving the comparison results of the corresponding comparison circuit and the comparison circuit in one higher order for outputting the signal according to the comparison results.

6. A device for converting an analog signal into a digital signal having N-bits, comprising:
    (a) at least $2^N - 1$ number of comparators divided into $2^{N-M}$ number of comparator groups, where M is a digit less than N, each for receiving and comparing the analog voltage with a predetermined voltage and outputting a signal when the analog signal is substantially equal to a predetermined voltage;
    (b) an M-bit encoder connected to the comparators belonging to each corresponding comparator group for receiving and encoding the signals from the comparators, the M-bit encoder having a block indicating line for transmitting a block indicating signal whether at least one comparator belonging to the corresponding comparator group outputs the signal and outputting the M-bit encoded signal;
    (c) a single N-bit encoder for receiving the M-bit encoded signal from each M-bit encoder and outputting an N-bit encoded digital signal; and
    (d) means for suppressing bit indication errors in the N-bit encoded digital signal of the N-bit encoded digital signal, the suppressing means being electrically disposed between each M-bit encoder and the N-bit encoder except at least one of the M-bit encoders in a highest order and lowest order, preventing the superposition of the signals derived from both M-bit encoders mutually adjacent to each other, and being activated upon receipt of an output inhibit signal derived from either of the adjacent M-bit encoder, the output inhibit signal being derived from the output signal of at least one comparator connected to the corresponding M-bit encoder.

7. A device as set forth in claim 6, wherein the means comprises an M number of gate circuits which receive the output inhibit signal and the M-bit encoded signal from the corresponding M-bit encoder and inhibits the transmission of the M-bit encoded signal upon receipt of the output inhibit signal.

8. A device as set forth in claim 6, wherein the comparator which derives the output inhibit signal is a lowest order comparator in the corresponding group.

9. A device as set forth in claim 6, wherein the comparator which derives the output inhibit signal is a highest order comparator in the corresponding group.

10. A device as set forth in claim 6, which further comprises a latch circuit connected between the corresponding M-bit encoder and the means for latching the M-bit encoded signal and block indicating signal.

11. A device for converting an analog signal into an eight-bit digital signal, comprising:
(a) 255 comparators divided into four groups, each for receiving and comparing the analog signal with a predetermined voltage and outputting a signal according to the comparison results;
(b) four six-bit encoders, each disposed so as to receive the signals from the comparators belonging to the corresponding comparator group, having a block indicating line for transmitting a block indicating signal whether any one comparator in the corresponding comparator group outputs the signal, and outputting the six-bit encoded signal;
(c) a single eight bit encoder for receiving the six-bit encoded signal and outputting the eight-bit encoded digital signal; and
(d) four error suppression circuits each for inhibiting the transmission of the six-bit encoded signal from the six-bit encoder belonging to the corresponding comparator group to the N-bit encoder upon receipt of an output inhibit signal, the output inhibit signal being the block indicating signal derived from one of the six-bit encoders belonging to one of the other groups which is one higher or lower order and the block indicating line of each six-bit encoder being connected to at least one output terminal of the comparator in a lowest or highest order belonging to the corresponding group connected to the six-bit encoder.

* * * * *